(12) United States Patent
Lieb et al.

(10) Patent No.: US 11,143,722 B2
(45) Date of Patent: Oct. 12, 2021

(54) ISOTROPIC AND ALL-OPTICAL SCALAR MAGNETOMETER FOR MEASURING AN AMBIENT MAGNETIC FIELD

(71) Applicant: COMMISSARIAT À L'ÉNERGIE ATOMIQUE ET AUX ÉNERGIES ALTERNATIVES, Paris (FR)

(72) Inventors: Gaëtan Lieb, Grenoble (FR); Agustin Palacios Laloy, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/801,282

(22) Filed: Feb. 26, 2020

(65) Prior Publication Data

US 2020/0278404 A1    Sep. 3, 2020

(30) Foreign Application Priority Data

Feb. 28, 2019  (FR) ...................................... 1902087

(51) Int. Cl.
*G01R 33/26* (2006.01)
(52) U.S. Cl.
CPC .................... *G01R 33/26* (2013.01)
(58) Field of Classification Search
CPC ............................. G01R 33/26; G01R 33/032
See application file for complete search history.

(56) References Cited

U.S. PATENT DOCUMENTS 5,357,199 A    10/1994  Leger et al.
5,534,776 A    7/1996   Leger et al.
(Continued)

FOREIGN PATENT DOCUMENTS

EP    0579537 B1    10/1997
EP    3115799 A1    1/2017
FR    2713347 B1    12/1995

OTHER PUBLICATIONS

Preliminary French Search Report for Appliciation No. FR1902087 dated Dec. 3, 2019.
(Continued)

*Primary Examiner* — Jay Patidar
(74) *Attorney, Agent, or Firm* — Pearne & Gordon LLP

(57) ABSTRACT

An optical-pumping magnetometer intended to measure an ambient magnetic field. It comprises: an arrangement for illuminating a cell filled with an atomic gas with a pump beam and an AC Stark effect beam propagating collinearly or almost collinearly in the cell, the pump beam being tuned to an atomic transition line, modulated by a first modulator by way of a first modulation frequency ($f_{m1}$) and polarised linearly in a polarisation direction that can be turned by a polarisation rotator, the AC Stark effect beam being offset from the atomic transition line, modulated by a second modulator by way of a second modulation frequency ($f_{m2}$) and polarised circularly, a first control circuit acting on the polarisation rotator in order to keep a constant angle (β) between the polarisation direction of the pump beam and the ambient magnetic field, a second control circuit acting on the first and second modulator in order to keep the first and second modulation frequency at the Larmor frequency of the atomic gas or at one of the harmonics thereof.

14 Claims, 3 Drawing Sheets

(56) References Cited

U.S. PATENT DOCUMENTS

| | | | |
|---|---|---|---|
| 9,970,999 B2* | 5/2018 | Larsen | G01R 33/26 |
| 2017/0010337 A1* | 1/2017 | Morales | G01R 33/26 |
| 2018/0164102 A1 | 6/2018 | Morales et al. | |
| 2019/0003833 A1 | 1/2019 | Palacios Laloy | |
| 2019/0074660 A1 | 3/2019 | Beato et al. | |
| 2019/0107395 A1 | 4/2019 | Palacios Laloy et al. | |
| 2019/0250223 A1 | 8/2019 | Palacios Laloy | |
| 2020/0018802 A1 | 1/2020 | Palacios Laloy et al. | |

OTHER PUBLICATIONS

Zhivun, Elena et al. "Alkali-vapor magnetic resonance driven by fictitious radiofrequency fields" In: Applied Physics Letters 105, Nov. 10, 2014, vol. 105, No. 19, pp. 192406-1-192406-4.

Zaisheng et al. "All-optical 4He magnetometer driven by fictitious oscillating magnetic field" In: 2017 Conference on Lasers and Electro-Optics, The Optical Society, May 14, 2017, pp. 1-2.

Lieb, G. et al. "All-optical isotropic scalar 4He magnetometer based on atomic alignment" In: Review of Scientific Instrucments, Jul. 8, 2019, vol. 90, No. 7, pp. 075104-1-075104-7.

Specification and drawings for US patent application titled "Compact Hanle Effect Magnetometer", U.S. Appl. No. 16/675,828, filed Nov. 6, 2019.

Specification and drawings for US patent application titled "Magnetometer With Optical Pumping of a Sensitive Element With Linearly Polarised Light and Multiple-Pass in the Sensitive Element", U.S. Appl. No. 16/723,096, filed Dec. 20, 2019.

* cited by examiner

ISOTROPIC AND ALL-OPTICAL SCALAR MAGNETOMETER FOR MEASURING AN AMBIENT MAGNETIC FIELD

CROSS-REFERENCE TO RELATED APPLICATIONS

This application claims priority from French Patent Application No. 1902087 filed on Feb. 28, 2019. The content of this application is incorporated herein by reference in its entirety.

TECHNICAL FIELD

The field of the invention is that of optical-pumping scalar magnetometers. The invention relates more particularly to a so-called isotropic magnetometer configuration for which the measurements are not dependent on the relative orientation of the magnetometer with respect to the magnetic field to be measured.

PRIOR ART

Optical-pumping magnetometers use atomic gases confined in a cell, typically metastable helium or alkaline gases, as a sensitive element. These magnetometers, which may adopt various configurations, make it possible to determine the magnetic field by using the following three processes, which take place either sequentially or concomitantly:

The use of polarised-light sources, typically lasers, makes it possible to prepare atomic states characterised by a certain orientation or alignment of the spins thereof. This process receives the name "optical pumping" in the field.

These atomic states change under the effect of the magnetic field, in particular under the Zeeman effect, which corresponds to shifts in the energy levels as a function of the magnetic field to which the atoms are subjected.

The optical properties of the atomic medium then undergo modifications that are dependent on the state of the atoms. It is thus possible, by means of an optical measurement, for example by a measurement of optical absorption, to determine the Zeeman shift undergone, and to derive therefrom a measurement of the magnetic field in which the cell is immersed.

According to the various possible configurations of the existing optical-pumping magnetometers, a measurement of the modulus, also referred to as the norm, of the magnetic field for scalar magnetometers, or a determination of the various components of the magnetic field for vector magnetometers, can be distinguished.

A simple configuration of a scalar magnetometer uses a pump beam polarised linearly so as to cause an alignment polarisation on the atoms of an atomic gas and an assembly of coils generating a radio-frequency magnetic field (RF field) that excites the magnetic resonance. If the frequency of the RF field is varied around the Larmor frequency, there are observed, on a photodetection signal, signals at zero frequency (resonance signal LA0), around the Larmor frequency (resonance signal LA1) and around twice the Larmor frequency (resonance signal LA2). The amplitude of these resonance signals that serve to make a scalar measurement of an ambient field is a function of the orientation of the polarisation vector of the pump beam with respect to the ambient field. The result of this is that the sensitivity of the magnetometer is not constant vis-à-vis these geometric parameters. This spatial anisotropy of the amplitude of the measurement signal exhibits in particular "dead angles", or shadow zones, for which the measurement signal disappears so that it becomes impossible to measure the magnetic field (this is the case at an angle of 54.7° between the magnetic field to be measured and the polarisation of the light for helium-4 for example).

This loss of the signal is not wanted, and various configurations for overcoming it have been proposed. It has in particular been proposed to use a plurality of magnetometers disposed so that their shadow zones are complementary. This solution is however bulky and sensitive to gradients.

Another solution for providing isotropy is described in the patent EP 0 579 537 B1. It involves controlling the polarisation of the light by turning it with a polariser disposed on a non-magnetic motor so that it is always situated at 90° from the local magnetic field. This condition can be stabilised by using the LA1 signal, which is cancelled out and changes sign when the angle between the magnetic field and the polarisation of the light is at 90°. The LA2 and LA0 signals are not cancelled out at 90° and can then be used for measuring the field.

In these two configurations, the RF field is generated by means of coils. However, these coils contribute to the bulk of the magnetometer and may cause crosstalk between adjacent magnetometers, for example in the case where a plurality of magnetometers are used to form a gradiometer.

In order to dispense with the coils, several solutions are possible. The effect known as "light shift" or "AC-Stark shift", provided by means of a circularly polarised light beam not tuned to an atomic transition, thus makes it possible to create the equivalent of a magnetic field in the gas without using coils (then a fictitional magnetic field is spoken of). Modulation of the intensity of the light beam makes it possible to create the equivalent of an RF field. This technique is in particular disclosed in the article by E. Zhivun et al. "Alkali-vapor magnetic resonance driven by fictitious radiofrequency fields", Applied Physics Letters, vol. 105, no 19, p. 192406, November 2014. This magnetometer does nevertheless have shadow zones and, in order to obtain an isotropic functioning, it is then necessary to use two "light-shift" beams modulated for intensity, perpendicular to one another and perpendicular to the pump beam in order to create the equivalent of an RF field the orientation of which remains collinear with the polarisation of the pump beam. This solution therefore requires three optical accesses in order to ensure isotropy of the measurement, which proves to be bulky.

Another type of configuration for dispensing with coils is based on a modulation of the intensity, of the wavelength or of the polarisation of the pump beam that makes it possible to generate optical resonance. However, this configuration does not make it possible to use the control scheme of the patent EP 0 579 537 B1 presented above for providing isotropy of the sensor. This is because the resonance signals do not exhibit the behaviours described above, namely the existence of an angle where one of the signals changes sign (so as to be able to control the polarisation) whereas another signal remains non-zero (so as to be able to measure the magnetic field).

The patent EP 3 115 799 B1 of the Applicant describes an architecture that combines two modulations of the pump beam in order to obtain an operating point that presents a change of sign of the signal LA1 allowing control of the polarisation angle, while keeping, at this same angle, a non-zero signal LA2 that allows magnetic measurement. However, the angle at which this condition is satisfied varies according to several experimental parameters and this architecture in general exhibits a non-optimal signal to noise ratio since the change in sign of the signal LA1 does not correspond to the maximum of the signal LA2.

DISCLOSURE OF THE INVENTION

The objective of the invention is to propose an isotropic magnetometer architecture that is compact and offers good measurement sensitivity. To this end, the invention relates to an optical-pumping magnetometer intended for measuring an ambient magnetic field, comprising:

means for illuminating a cell filled with an atomic gas with a pump beam and an AC Stark-effect beam, the pump beam being tuned to an atomic transition line, modulated by a first modulator by means of a first modulation frequency and linearly polarised in a polarisation direction that can be turned by a polarisation rotator, the AC Stark-effect beam being offset from the atomic transition line, modulated by a second modulator by means of a second modulation frequency and polarised circularly, a first control circuit acting on the polarisation rotator in order to maintain a constant angle between the polarisation direction of the pump beam and the ambient magnetic field, a second control circuit acting on the first and second modulators in order to maintain the first and second modulation frequencies at the Larmor frequency of the atomic gas or one of the harmonics thereof.

Certain preferred but non-limitative aspects of this magnetometer are as follows:

the pump beam and the AC Stark-effect beam propagate collinearly in the cell; said means for illuminating the cell comprise an assembly of linear polarisation-maintenance fibres in which the pump beam and the AC Stark-effect beam are injected and a collimator at the output of said assembly for collimating the pump beam and the AC Stark-effect beam in the direction of the cell;

the pump beam and the AC Stark effect beam have, in said assembly, parallel propagation directions and polarisation directions forming between them an angle of 45°;

said means for illuminating the cell further comprise a quarter-wave plate interposed between the collimator and the cell and the neutral axes of which are at 45° from the linear polarisation direction of the AC Stark-effect beam in said assembly;

the polarisation rotator is interposed between the quarter-wave plate and the cell;

the pump beam and the AC Stark-effect beam propagate in opposite directions in the cell;

the pump beam and the AC Stark-effect beam have, in the cell, propagation directions forming between them a non-zero angle of less than 3°;

the first modulator performs an intensity or polarisation modulation of the pump beam and the first modulation frequency is slaved to twice the Larmor frequency;

the first modulator performs a wavelength modulation of the pump beam;

the pump beam is tuned to the centre of the atomic transition line and the first modulation frequency is slaved to the Larmor frequency;

the pump beam is tuned to half-way up the atomic transition line and the first modulation frequency is slaved to twice the Larmor frequency;

the second modulator performs an intensity modulation of the AC Stark-effect beam and the second modulation frequency is slaved to the Larmor frequency;

the first control circuit carries out a synchronous detection at the Larmor frequency and the second control circuit carries out a synchronous detection at twice the Larmor frequency.

BRIEF DESCRIPTION OF THE DRAWINGS

Other aspects, aims, advantages and features of the invention will emerge more clearly from a reading of the following detailed description of preferred embodiments thereof given by way of non-limitative example and made with reference to the accompanying drawings, in which.

DETAILED DESCRIPTION

Figure 1:
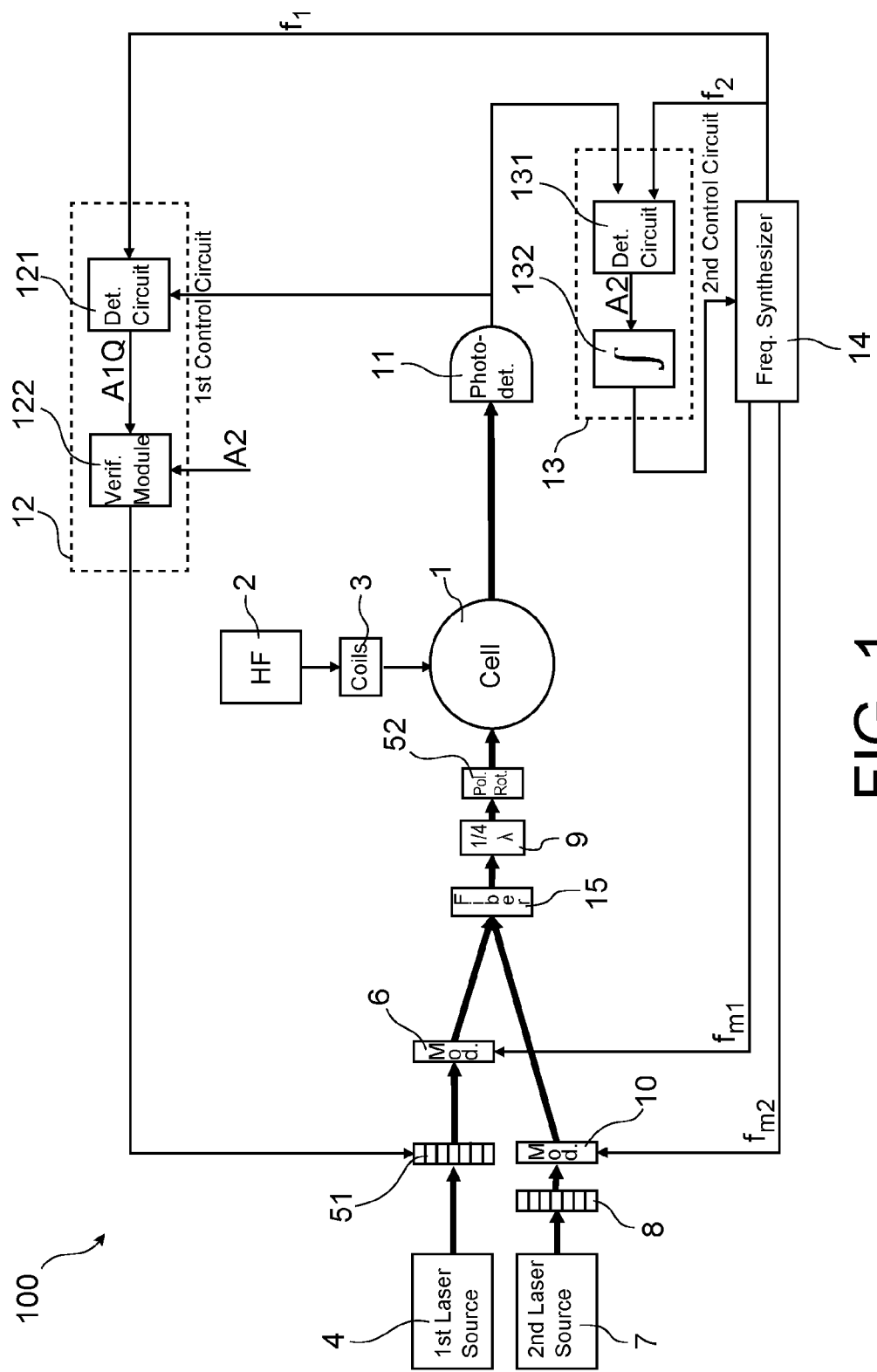
FIG. 1 is a diagram of a magnetometer according to a first possible embodiment of the invention.

With reference to FIG. 1, the invention relates to an optical pumping magnetometer 100. The magnetometer comprises a cell 1 filled with an atomic gas, for example helium-4 or an alkaline gas, subjected to an ambient magnetic field. The magnetometer comprises means for illuminating the cell with a pump beam and an AC Stark-effect beam. These beams preferably propagate collinearly or almost collinearly (with an angle typically of no more than 3° between them) in the cell and therefore require only one optical access. In the case where the sensitive element is helium-4, the magnetometer also comprises a high-frequency (HF) discharge system, comprising an HF generator 2 and overvoltage coils 3, for bringing the atoms of the atomic gas into an energised state where they are able to undergo the atomic transition when they are illuminated by the pump beam, typically into the metastable state $2^3S_1$.

The pump beam is tuned to an atomic transition line, for example to the line $D_0$ at 1083 nm in the case of helium-4. It makes it possible to carry out optical pumping of the metastable level $2^3S_1$ at the excited level $2^3P_0$.

The pump beam is polarised linearly. In the reference frame XYZ in FIG. 2, the pump beam propagates in a propagation direction $\vec{k}$ oriented along the X axis. Its polarisation direction $\vec{E}$, orthogonal to its propagation direction, is in the plane YZ. This polarisation direction $\vec{E}$ forms an angle $\beta$ with the ambient magnetic field $\vec{B_0}$. The projection of the ambient magnetic field $\vec{B_0}$ in the plane XZ forms an angle $\alpha$ with the propagation direction $\vec{k}$.

The pump beam may be emitted by a first laser source 4 and be polarised linearly by means of a rectilinear polariser 51 interposed between the laser source 4 and the cell 1 or directly integrated in the laser source 4.

In the context of the invention, the pump beam is modulated by a first modulator 6 by means of a first modulation frequency $f_{m1}$ that corresponds to the Larmor frequency of the atomic gas or to one of the harmonics thereof. The pump beam may be modulated in intensity, polarisation or wavelength.

The first modulator 6 may in particular perform an intensity or polarisation modulation of the pump beam, the first modulation frequency being slaved to twice the Larmor frequency.

The first modulator 6 may alternatively perform a wavelength modulation of the pump beam. When the pump beam is tuned to the centre of the atomic transition line, the first modulation frequency is slaved to the Larmor frequency. When the pump beam is tuned to the flank of the atomic transition line, for example to half-way up the atomic transition line, the first modulation frequency is slaved to twice the Larmor frequency.

An intensity modulation may for example be carried out by means of an acousto-optical modulator. A polarisation modulation may for example be carried out by means of an electro-optical modulator. A wavelength modulation may for example be carried out by superimposing a modulation current on the supply currents of the laser.

The invention moreover uses a so-called AC Stark-effect beam the role of which is to generate a fictional RF magnetic field in the cell. This AC Stark-effect beam is offset (i.e. not tuned) from the atomic transition line and polarised circularly. It may be emitted by a second laser source 7 and be polarised circularly by associating a rectilinear polariser 8 (optionally directly integrated in the laser source 7) and a quarter-wave plate 9. It is modulated by a second modulator 10 by means of a second modulation frequency $f_{m2}$, typically in intensity, the second modulation frequency being slaved to the Larmor frequency.

A polarisation rotator 52, for example a liquid-crystal rotator, is interposed between the quarter-wave plate 9 and the cell 1. The rotator 52 makes it possible to orient the polarisation of the pump beam in any direction orthogonally to the propagation direction thereof so as to keep constant the angle β between the polarisation direction of the pump beam and the direction of the magnetic field, and this whatever the orientation of the sensor. It keeps invariant the circular polarisations that pass through it, in particular the circular polarisation of the AC Stark-effect beam.

The magnetometer moreover comprises a frequency synthesiser 14 that generates the modulation frequencies $f_{m1}$ and $f_{m2}$. It also comprises a photodetector 11 that receives the beam that has passed through the cell and supplies an electrical signal to a first control circuit 12 and to a second control circuit 13. The first control circuit 12 acts on the polarisation rotator 52 in order to keep constant the angle β between the polarisation direction of the pump beam and the ambient magnetic field. The second control circuit 13 acts on the first and second modulators 6, 10 in order to keep the first and second modulation frequencies at the Larmor frequency of the atomic gas or at one of the harmonics thereof. These control circuits 12, 13 may in particular be implemented in accordance with the patent FR 2713347 B1.

The first control circuit 12 comprises a detection circuit 121 that receives the signal issuing from the photodetector 11 and carries out a synchronous detection at a first reference frequency $f_1$ supplied by the frequency synthesiser 14 in order to detect the component A1Q that serves as an error signal for controlling the polarisation rotator so that the angle β remains constant, with preferably β=90°.

The second control circuit 13 comprises a detection circuit 131 that receives the signal coming from the photodetector 1 and performs a synchronous detection at a second reference frequency $f_2$ supplied by the frequency synthesiser 14 in order to detect the component A2 at twice the Larmor frequency. The detection circuit 131 may be followed by an integrator 132. The second control circuit 13 supplies as an output a set value that makes it possible to control the generation of the modulation frequencies $f_{m1}$, $f_{m2}$ and of the references frequencies $f_1$, $f_2$ by the frequency synthesiser 14 so that they are established in accordance with $f_1 = f_{m2} = F_L$, $f_2 = 2*F_L$ and $f_{m1} = F_L$ or $2*F_L$ according to the modulation adopted for the pump beam, where $F_L$ designates the Larmor frequency of the atomic gas. This frequency, directly related to the magnetic field $B_0$ by the gyromagnetic ratio γ according to $F_L = \gamma B_0$, can be measured by means of a frequency meter.

The first control circuit 12 may, by means of a verification module 122, check that the cancellation condition of the component A1Q does indeed operate for a non-zero value of the component A2.

Figure 2:
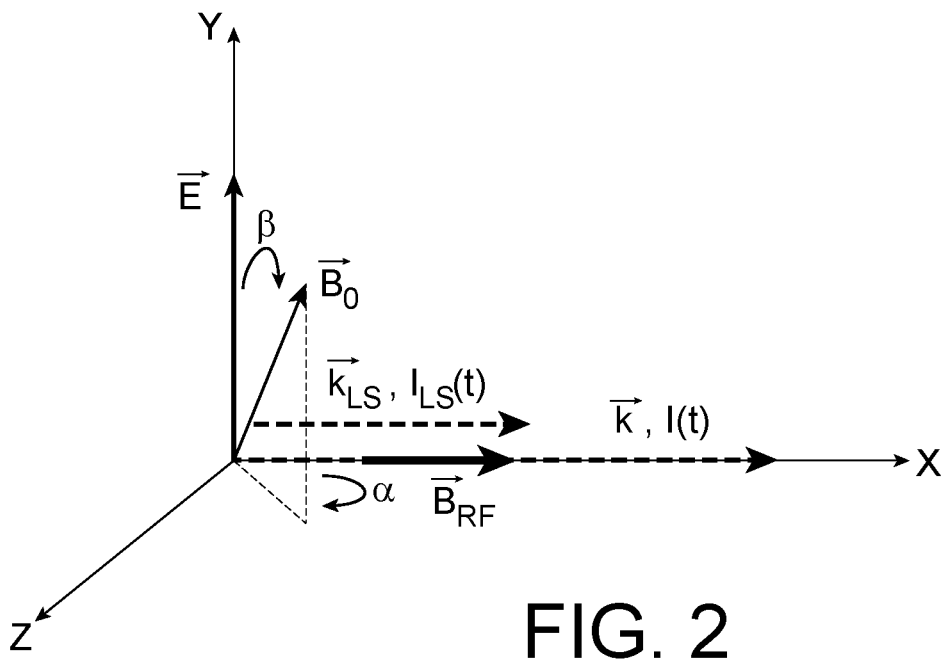
FIG. 2 is a diagram illustrating the geometry of the beams with respect to the magnetic field to be measured.

Taking the example of FIG. 2, the linearly polarised pump beam can propagate along the X axis and have its intensity modulated according to $I(t)=I_0(1+\cos(2\omega t))$ at a frequency twice the Larmor frequency $F_L = \omega/2\pi$. The AC Stark effect beam propagates in the cell along the same X axis. It is polarised circularly, its intensity is modulated as $I_{LS}(t) = I_{0LS}(1+\cos(\omega t))$ at the Larmor frequency. The AC Stark effect beam makes it possible to generate a fictitious RF field $\vec{B}_{RF}$ oriented along the X axis.

Figure 3:
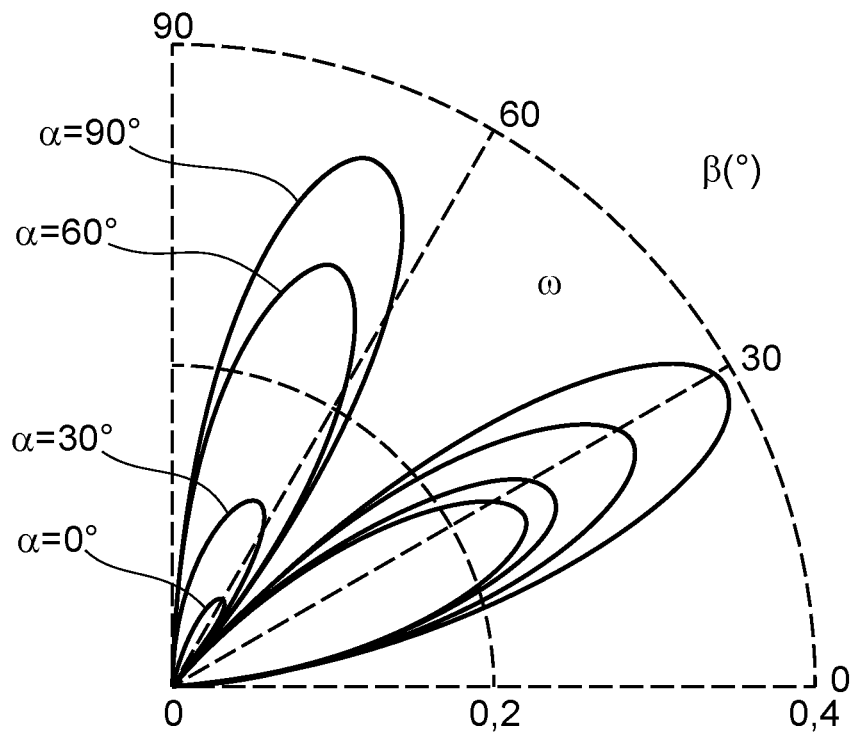
FIG. 3 shows the amplitude of the resonance component at the Larmor frequency as a function of the angle $\beta$ between the polarisation of the pump beam and the magnetic field.
Figure 4:
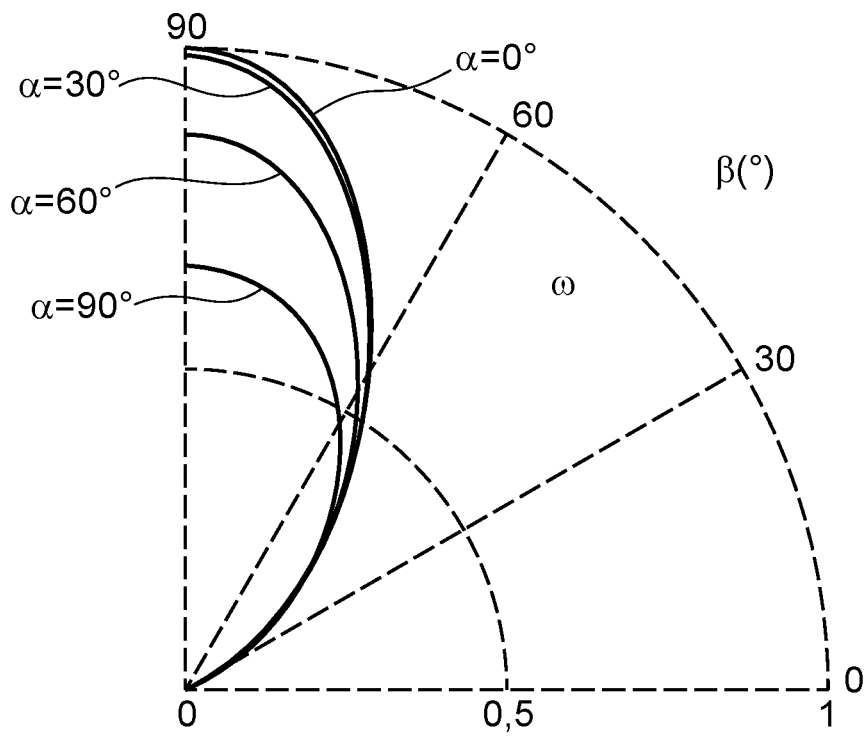
FIG. 4 shows the amplitude of the resonance component at twice the Larmor frequency as a function of the angle $\beta$ between the polarisation of the pump beam and the magnetic field.

FIG. 3 shows the amplitude in polar coordinates of the component A1Q at the Larmor frequency and FIG. 4 the amplitude in polar coordinates of the component A2 at twice the Larmor frequency, as a function of the angle β. It is seen from FIG. 3 that at β=90°, the signals detected at ω cancel out and have one of the components changing sign at the 90° passage. And it can be seen from FIG. 4 that the signals detected at 2ω are non-zero at β=90° and in addition have a maximum amplitude at this angle. The invention therefore makes it possible to produce an all-optical magnetometer which has a point with which it is possible to abide (β=90°) in order to provide isotropy while ensuring maximum resolution.

In a first embodiment shown schematically in FIG. 1, said means for illuminating the cell comprise an assembly of linear polarisation maintenance fibres 15 in which the pump beam and the AC Stark effect beam are injected and a collimator at the output of said assembly for collimating the pump beam and the AC Stark effect beam in the direction of the cell.

In an assembly of fibres, one end of each of the fibres is bared and is assembled with the ends of the other fibres in a ferrule, for example a part with V-shaped grooves. Thus the propagation directions of all the beams are fixed. At the output of the assembly, the beams can be collimated by a common lens (which is possible given the very small separation between the fibres in the assembly of fibres, typically 100 μm) in order to cover the entire cell.

Since the fibres are of the polarisation maintenance type, relative polarisation directions can be fixed. It is possible in particular to provide that, in said assembly, the pump beam and the AC Stark effect beam have parallel propagation directions and polarisation directions forming between them an angle of 45°. In such a case, the neutral axes of the quarter-wave plate axes 9 interposed between the collimator and the cell are at 45° from the linear polarisation direction of the AC Stark effect beam in said assembly. The AC Stark effect beam is thus polarised circularly whereas the pump beam, the polarisation direction of which is along one of the neutral axes of the quarter-wave plate, remains polarised linearly.

Figure 5:
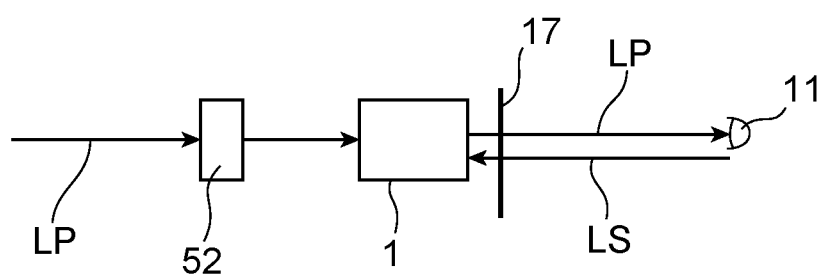
FIG. 5 is a diagram of a magnetometer according to a second possible embodiment of the invention.

In a second embodiment shown schematically in FIG. 5, the pump and AC Stark effect beams propagate in opposite directions in the cell. In this way, only the pump beam is photodetected and the signal to noise ratio is increased.

In this second embodiment, the modulated and linearly polarised pump beam FP is injected into a linear polarisation maintenance fibre. A collimator is arranged at the output of said fibre in order to collimate the pump beam in the direction of the polarisation rotator 52 upstream of the cell 1. The pump beam at the output of the cell is collected by the photodetector 11.

The AC Stark effect beam LS is also injected into a linear polarisation maintenance fibre. A collimator is arranged at the output of said fibre in order to collimate the AC Stark effect beam in the direction of a quarter-wave plate 17 here arranged downstream of the cell. The pump beam and the AC Stark effect beam may have propagation directions in the cell forming between them a non-zero angle, preferably an angle of less than 3°. This makes it possible to avoid the AC Stark effect beam being collected, after having passed through the cell, by the collimator equipping the fibre in which the pump beam is injected and damaging the laser that generates the pump beam.

The invention claimed is:

1. An optically-pumped magnetometer for measuring an ambient magnetic field, comprising:
    means for illuminating a cell filled with an atomic gas with a pump beam and an AC Stark effect beam,
        the pump beam being tuned to an atomic transition line, modulated by a first modulator at a first modulation frequency and linearly polarised in a polarisation direction that is adapted for rotation by a polarisation rotator,
        the AC Stark effect beam being offset from the atomic transition line, modulated by a second modulator at a second modulation frequency and polarised circularly;
    a first control circuit acting on the polarisation rotator in order to keep a constant angle between the polarisation direction of the pump beam and the ambient magnetic field; and
    a second control circuit acting on the first and second modulator in order to keep the first and second modulation frequency at the Larmor frequency of the atomic gas or at one of the harmonics thereof.

2. The optically-pumped magnetometer according to claim 1, wherein the pump beam and the AC Stark effect beam propagate collinearly in the cell.

3. The optically-pumped magnetometer according to claim 2, wherein said means for illuminating the cell comprise an assembly of linear polarisation maintenance fibres in which the pump beam and the AC Stark effect beam are injected and a collimator at the output of said assembly for collimating the pump beam and the AC Stark effect beam in the direction of the cell.

4. The optically-pumped magnetometer according to claim 3, wherein the pump beam and the AC Stark effect beam have in said assembly parallel propagation directions and polarisation directions forming an angle of 45° between them.

5. The optically-pumped magnetometer according to claim 4, wherein said means for illuminating the cell further comprise a quarter-wave plate interposed between the collimator and the cell, neutral axes of the quarter-wave plate being at 45° from the linear polarisation direction of the AC Stark effect beam in said assembly.

6. The optically-pumped magnetometer according to claim 5, wherein the polarisation rotator is interposed between the quarter-wave plate and the cell.

7. The optically-pumped magnetometer according to claim 1, wherein the pump beam and the AC Stark effect beam propagate in opposite directions in the cell.

8. The optically-pumped magnetometer according to claim 7, wherein the pump beam and the AC Stark effect beam have in the cell propagation directions forming between them a non-zero angle of less than 3°.

9. The optically-pumped magnetometer according to claim 1, wherein the first modulator performs an intensity or polarisation modulation of the pump beam and the first modulation frequency is slaved to twice the Larmor frequency.

10. The optically-pumped magnetometer according to claim 1, wherein the first modulator performs a wavelength modulation of the pump beam.

11. The optically-pumped magnetometer according to claim 10, wherein the pump beam is tuned to the centre of the atomic transition line and the first modulation frequency is slaved to the Larmor frequency.

12. The optically-pumped magnetometer according to claim 10, wherein the pump beam is tuned to half-way up the atomic transition line and the first modulation frequency is slaved to twice the Larmor frequency.

13. The optically-pumped magnetometer according to claim 1, wherein the second modulator performs an intensity modulation of the AC Stark effect beam and the second modulation frequency is slaved to the Larmor frequency.

14. The optically-pumped magnetometer according to claim 1, wherein the first control circuit performs a synchronous detection at the Larmor frequency and the second control circuit performs a synchronous detection at twice the Larmor frequency.

* * * * *